(12) United States Patent
Takaishi

(10) Patent No.: US 7,872,301 B2
(45) Date of Patent: Jan. 18, 2011

(54) SEMICONDUCTOR DEVICE AND METHOD OF MANUFACTURING THE SAME

(75) Inventor: Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 58 days.

(21) Appl. No.: 12/121,203

(22) Filed: May 15, 2008

(65) Prior Publication Data

US 2008/0283907 A1    Nov. 20, 2008

(30) Foreign Application Priority Data

May 17, 2007    (JP)    ............................. 2007-132164

(51) Int. Cl.
*H01L 29/00* (2006.01)
*H01L 21/3205* (2006.01)
(52) U.S. Cl. ..................... 257/328; 257/330; 257/336; 257/E21.294; 257/E29.001; 257/E29.262; 438/270; 438/585
(58) Field of Classification Search ............... 257/4, 257/306–309, 328, 336, 330, E21.654, E21.657, 257/E29.262, E29.268, E21.41, E21.294, 257/E21.09, E29.001, E47.001; 438/270, 438/396, 585
See application file for complete search history.

(56) References Cited

U.S. PATENT DOCUMENTS

2003/0001290 A1*    1/2003    Nitayama et al. ........... 257/907

2004/0150028 A1*    8/2004    Horiguchi .................. 257/306

FOREIGN PATENT DOCUMENTS

| JP | H5-136374 A | 6/1993 |
|---|---|---|
| JP | H6-209089 A | 7/1994 |
| JP | H9-8295 A | 1/1997 |
| JP | 2002-83945 A | 3/2002 |
| JP | 2003-303901 A | 10/2003 |

* cited by examiner

*Primary Examiner*—Sue Purvis
*Assistant Examiner*—Whitney Moore
(74) *Attorney, Agent, or Firm*—Sughrue Mion, PLLC

(57) ABSTRACT

A semiconductor device is provided with first and second silicon pillars formed substantially perpendicularly to a main surface of a substrate, a gate electrode covering side surfaces of the first and second silicon pillars via a gate insulation film, first and second diffusion layers provided on a lower part and an upper part of the first silicon pillar, respectively, a cap insulation film covering an upper part of the second silicon pillar, a gate contact connected to the gate electrode, and a protection insulation film in contact with the upper surfaces of the first and second silicon pillars. The gate contact is connected to an upper region of the gate electrode provided at the periphery of the cap insulation film. An opening is formed on the protection insulation film provided at the side of the first silicon pillar.

16 Claims, 21 Drawing Sheets

SEMICONDUCTOR DEVICE AND METHOD OF MANUFACTURING THE SAME

TECHNICAL FIELD

The present invention relates to a semiconductor device and a method of manufacturing the same, and more particularly relates to a semiconductor device having a vertical transistor using a silicon pillar, and a method of manufacturing the semiconductor device.

BACKGROUND OF THE INVENTION

The integration of the semiconductor device has hitherto been achieved mainly by miniaturizing transistors. However, miniaturization of transistors has come to the limit, and when the transistors are attempted to be more miniaturized, there is a risk that the semiconductor device does not operate correctly due to the short-channel effect and the like.

As a method of basically solving this problem, there has been proposed a method of three-dimensionally processing a semiconductor substrate, thereby three-dimensionally forming a transistor. A three-dimensional transistor using a silicon pillar extending perpendicularly to the main surface of the semiconductor substrate as a channel has an advantage in that an occupied area is small and that a large drain current is obtained by a complete depletion. This three-dimensional transistor can be also used for a closest layout of $4F^2$ (see Japanese Patent Application Laid-open Nos. 2003-303901, H5-136374, H6-209089, H9-8295, and 2002-83945).

In a vertical transistor using a silicon pillar, a gate electrode is positioned on the side surface of the silicon pillar, and a diffusion layer becoming a source or a drain is formed on the upper part of the silicon pillar. Therefore, the gate electrode cannot be easily connected to the upper-layer wiring. For example, there is considered a method of drawing a gate electrode to a flat region of a silicon substrate and connecting a gate contact to this drawing electrode portion. However, according to this method, the gate needs to be patterned by photolithography and etching. Not only the processing process of the gate electrode increases but also a large stage due to the silicon pillar hinders lithography. Therefore, it is extremely difficult to pattern in high precision a gate electrode having a three-dimensional structure.

SUMMARY OF THE INVENTION

It is therefore an object of the present invention to provide an improved semiconductor device having a vertical transistor using a silicon pillar and a method of manufacturing the same.

Another object of the present invention is to provide a semiconductor device having a vertical transistor using a silicon pillar and requiring no patterning of a gate electrode, and a method of manufacturing the same.

Still another object of the present invention is to provide a semiconductor device having a vertical transistor using a silicon pillar and capable of easily connecting between a gate electrode and an upper-layer wiring, and a method of manufacturing the same.

The above and other objects of the present invention can be accomplished by a semiconductor device including first and second silicon pillars formed substantially perpendicularly to a main surface of a substrate, a gate electrode covering side surfaces of the first and second silicon pillars via a gate insulation film, first and second diffusion layers provided on a lower part and an upper part of the first silicon pillar, respectively, a cap insulation film covering an upper part of the second silicon pillar, and a gate contact connected to the gate electrode, wherein the gate contact is connected to an upper region of the gate electrode provided at the periphery of the cap insulation film.

The above and other objects of the present invention can also be accomplished by a semiconductor device including first and second silicon pillars formed substantially perpendicularly to a main surface of a substrate, a gate electrode covering side surfaces of the first and second silicon pillars via a gate insulation film, first and second diffusion layers provided on a lower part and an upper part of the first silicon pillar, respectively, a gate contact connected to the gate electrode, a first diffusion layer contact connected to the first diffusion layer, and a second diffusion layer contact connected to the second diffusion layer, wherein the second diffusion layer contact is formed above the first silicon pillar, and the gate contact is formed above the silicon pillar.

The "above the silicon pillar" means the opposite side of the substrate from the viewpoint of the silicon pillar. Similarly, "a lower part and an upper part of the silicon pillar" means a region at the substrate side and a region at the opposite side of the substrate, respectively from the viewpoint of the silicon pillar. Furthermore, "a lower part and an upper part of the silicon pillar" do not need to be right above and right below the silicon pillar, respectively. Further, "a lower part and an upper part of the silicon pillar" can be configured by a part of the silicon pillar, respectively, or can be configured by parts separate from the silicon pillar.

According to the semiconductor device of the present invention, a gate electrode at the first silicon pillar side as the transistor pillar is connected to the gate contact via the gate electrode at the second silicon pillar side. Therefore, a connection between the gate electrode and gate contact can be secured without performing a special patterning to form a flat part of the gate electrode. Therefore, the gate electrode can be securely connected to the wiring of the upper layer.

In the present invention, an interval between the first silicon pillar and the second silicon pillar is preferably set smaller than two times a film thickness of the gate electrode. According to this aspect, the gate electrode at the first silicon pillar side can be securely connected to the gate electrode at the second silicon pillar side.

Furthermore, the above and other objects of the present invention can be accomplished by a method of manufacturing a semiconductor device including a silicon-pillar forming step of forming first and second silicon pillars substantially perpendicularly to a main surface of a substrate, a first diffusion layer forming step of forming a first diffusion layer at a lower part of the first silicon pillar, a gate insulation film forming step of forming a gate insulation film on side surfaces of the first and second silicon pillars, a gate electrode forming step of forming a gate electrode so that a gap between the first silicon pillar and the second silicon pillar is practically filled in, a gate electrode processing step of removing the gate electrode formed on a surface parallel with the substrate, by etching back the gate electrode, a second diffusion layer forming step of forming a second diffusion layer on an upper part of the first silicon pillar, and a gate-contact forming step of forming a gate contact at a part covering the second silicon pillar, out of the gate electrode.

According to the present invention, a transistor pillar and a dummy silicon pillar are simultaneously formed, and the gate electrode of the transistor can be secured through the gate electrode formed on the dummy pillar. Therefore, a gate contact can be secured without performing photolithography to the gate electrode of a three-dimensional structure.

In the present invention, the first and second silicon pillars are preferably formed simultaneously using a hardmask. According to this aspect, the interval between the first and second silicon pillars can be controlled in high precision. Therefore, the gate electrodes formed on the silicon pillars can be securely connected to each other.

In the present invention, the gate electrode is preferably formed without removing the hardmask. According to this aspect, a self-aligned space (through-hole) can be formed at the upper part of the silicon pillar, by removing the hardmask after forming the gate electrode. Therefore, the second diffusion layer can be formed in self-alignment on the first silicon pillar, by forming the second diffusion layer within the through-hole.

As explained above, according to the present invention, a connection between the gate contact and the gate electrode can be secured, without processing the gate electrode having a three-dimensional structure by photolithography.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be described in detail hereinafter with reference to the accompanying drawings.

Figure 1A:
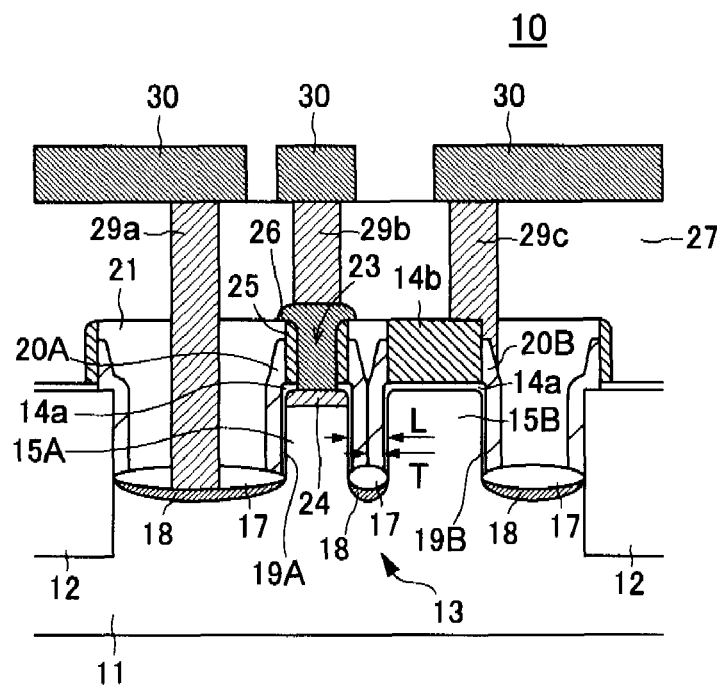
FIG. 1A is a schematic cross-sectional view and a schematic top plan view showing a structure of a semiconductor device according to a preferred embodiment of the present invention.
Figure 1B:
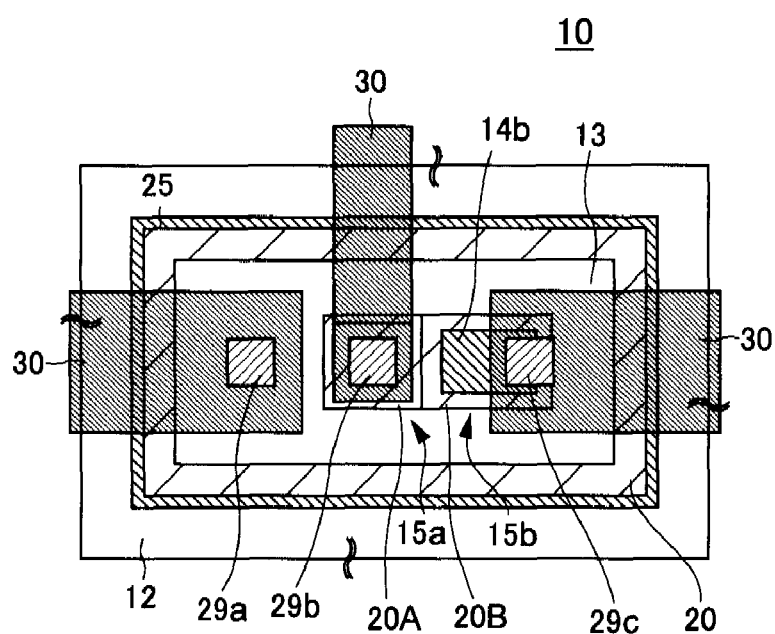
FIG. 1B is a schematic top plan view showing a structure of a semiconductor device according to a preferred embodiment of the present invention.

FIGS. 1A and 1B are a schematic cross-sectional view and a schematic top plan view, respectively showing a structure of a semiconductor device 10 according to a preferred embodiment of the present invention.

As shown in FIGS. 1A and 1B, the semiconductor device 10 according to the present embodiment is a vertical transistor using a silicon pillar, and includes an STI (Shallow Trench Isolation) 12 formed on a silicon substrate 11, first and second silicon pillars 15A and 15B formed in an active region encircled by the STI 12, a first gate electrode 20A covering a side surface of the first silicon pillar 15A via a first gate insulation film 19A, and a second gate electrode 20B covering a side surface of the second silicon pillar 15B via a second gate insulation film 19B. The semiconductor device 10 also includes a first diffusion layer 18 provided at a lower part of the first and second silicon pillars 15A and 15B, and a second diffusion layer 26 provided at an upper part of the second silicon pillar 15B. A first diffusion layer 18 is not positioned in a region right below the first and second silicon pillars 15A and 15B, but is positioned in a flat region of the silicon substrate 11 not covered with a silicon pillar.

The first diffusion layer 18 is connected to a wiring layer 30 via a first contact-plug 29*a*. The second diffusion layer 26 is connected to the wiring layer 30 via a second contact-plug 29*b*. A gate electrode 20 is connected to the wiring layer 30 via a third contact-plug (gate contact) 29*c*.

The first silicon pillar 15A is a transistor pillar, and the second silicon pillar 15B is a gate electrode pillar (dummy pillar). The first and second silicon pillars 15A and 15B are formed substantially perpendicularly to the main surface of the silicon substrate 11. A distance L between the two silicon pillars is set smaller than two times a thickness T of the gate electrode. By laying out the first and second silicon pillars 15A and 15B to close to each other in this way, the first gate electrode 20A formed on the side surface of the first silicon pillar 15B and the second gate electrode 20B formed on the side surface of the second silicon pillar 15B can be brought into contact with other, thereby ensuring an electric connection to each other.

Preferably, a size of the second silicon pillar 15B in the plane direction is set larger than that of the first silicon pillar 15A. While not particularly limited, preferably, a flat surface size of the first silicon pillar is set to about 70×70 nm, and a flat surface size of the second silicon pillar is set to about 100×70 nm. Accordingly, a distance between the second contact-plug 29*b* and the gate contact 29*c* can be increased, and therefore, a formation margin of the wiring layer 30 can be increased. Further, the plane region of the second gate electrode 20B at the second silicon pillar 15B increases, and therefore, the second gate electrode 20B can be securely connected to the gate contact 29*c*. The height of each silicon pillar can be set correspondingly to the required transistor characteristic. For example, when the plane size of the first silicon pillar is 70×70 nm, the height of each silicon pillar can be set to about 100 nm.

The first gate electrode 20A is formed on a side surface of the first silicon pillar 15A via the first gate insulation film 19A. An upper peripheral part of the first silicon pillar 15A is in contact with a protection insulation film 14*a*, and an upper center part of the first silicon pillar 15A is opened as a through-hole 23. On the other hand, a side surface and an upper surface of the second silicon pillar 15B are completely covered by the second gate insulation film 19B and the protection insulation film 14*a*. However, the second gate insulation film 19B is a dummy insulation film simultaneously formed with the first gate insulation film 19A, and functions as an insulation film, not as a gate insulation film of the transistor. The protection insulation film 14*a* is a part of a mask to form the first silicon pillar 15A and the second silicon pillar 15B, and includes a silicon oxide film.

A cap insulation film 14*b* is provided on an upper surface of the second gate electrode 20B. The cap insulation film 14*b* is a hardmask used to form the first and second silicon pillars 15A and 15B, and is also used as the insulation film without being removed in the subsequent process. A hardmask was also present above the first silicon pillar 15A, and was removed at the time of forming the through-hole 23 as the space to form the second diffusion layer 26.

The first and second gate electrodes 20A and 20B are formed on the external periphery of the corresponding gate insulation films 19A and 19B. Particularly, the second gate electrode 20B has a ring-shaped upper region covering the peripheral part of the cap insulation film 14b, and the gate contact 29c is connected to this upper region. More specifically, the gate contact 29c is connected to an interface between the cap insulation film 14b and the second gate electrode 20B remaining on the upper part of the second silicon pillar 15.

The first diffusion layer 18 is provided on a bottom part of an active region 13, that is, on the lower periphery of the first silicon pillar 15A. A conductive material used as the second diffusion layer 26 is embedded into the through-hole 23 provided on the upper part of the first silicon pillar 15A. The first and second diffusion layers 18 and 26 can be formed by ion-implanting an impurity having conductivity type opposite to that of an impurity in the silicon substrate.

The second diffusion layer 26 is connected to an LDD (Lightly Doped Drain) region 24 formed on the upper part of the first silicon pillar 15A via the through-hole 23 piercing through the insulation films 14a and 21. A cylindrical sidewall insulation film 25 intervening between the second diffusion layer 26 and the first gate electrode 20A is formed on an inner wall surface of the through-hole 23, thereby securing insulation between the second diffusion layer 26 and the first gate electrode 20A. Thus, the side surfaces of the first silicon pillar 15A are substantially entirely covered with the first gate electrode 20A.

In the present embodiment, a planar position of the external periphery of the sidewall insulation film 25 and planar position of the external periphery of the first silicon pillar 15A substantially coincides with each other. This is because the sidewall insulation film 25 is formed within the through-hole 23 formed by removing a hardmask (corresponding to the cap insulation film 14b) used to form the silicon pillar, and because the size of the silicon pillar 15A approximately coincides with the size of the through-hole 23. This means that the space formed by removing the hardmask used to form the silicon pillar is used as a space to form the second diffusion layer 26.

The first to third contact-plugs 29a to 29c are formed by filling a conductive material into the contact-hole piercing through an interlayer insulation film 27. Polycrystalline silicon is preferably used for the material of the contact-plug. A lower end of the gate contact 29c is connected to an interface between the cap insulation film 14b and the second gate electrode 20B at the upper part of the second silicon pillar 15B.

In the semiconductor device 10 having the above configuration, the first diffusion layer 18 functions as one of a source and a drain, and the second diffusion layer 26 functions as the other of the source and the drain. The first gate electrode 20A is connected to the gate contact 29c through the second gate electrode 20B, and is further connected to the wiring layer 30. A channel region is formed in a vertical direction of the silicon pillar, and is controlled by an electric field from the first gate electrode 20A via the gate insulation film 19A.

As explained above, according to the semiconductor device 10 of the present embodiment, the second silicon pillar 15B as a dummy pillar is provided adjacently to the first silicon pillar 15A as a transistor pillar. The first gate electrode 20A and the gate contact 29c are connected to each other via the second gate electrode 20B formed on the side surface of the second silicon pillar 15B. Therefore, a gate electrode structure capable of being easily connected to the gate contact can be provided, without performing photolithography to form a flat part of the gate electrode.

Further, according to the present embodiment, a distance between the first silicon pillar 15A and the second silicon pillar 15B is set smaller than two times a film thickness of the gate electrode. Therefore, an electric connection can be securely obtained between the first gate electrode 20A at the first silicon pillar 15A side and the second gate electrode 20B at the second silicon pillar 15B side. Further, according to the present embodiment, the second diffusion layer 26 is provided within the through-hole 23 formed by removing a hardmask used to form the first silicon pillar 15A. Therefore, the second diffusion layer 26 can be formed in self-alignment to the first silicon pillar 15A, and consequently, the first silicon pillar 15A can be securely connected to the second diffusion layer 26.

A method of manufacturing the semiconductor device 10 according to the present embodiment is explained in detail below.

Figure 2A:
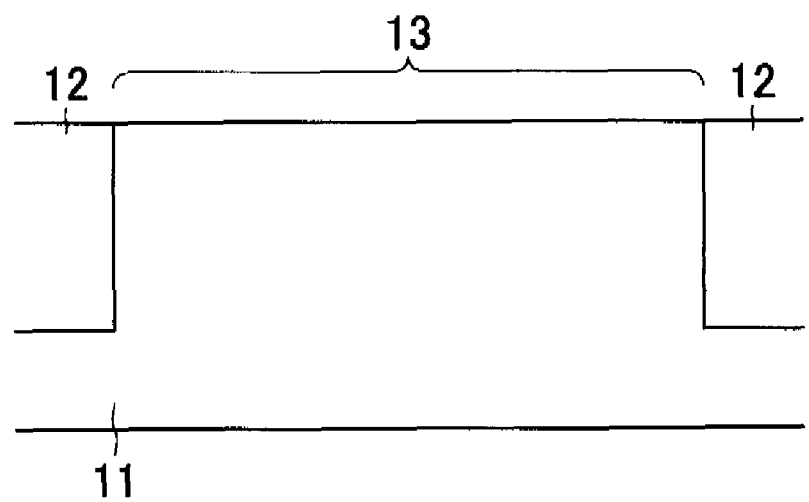
FIG. 2A is a schematic cross-sectional view showing a process for manufacturing the semiconductor device 10 according to the present embodiment (specifically forming STI 12 and active regions 13)
Figure 2B:
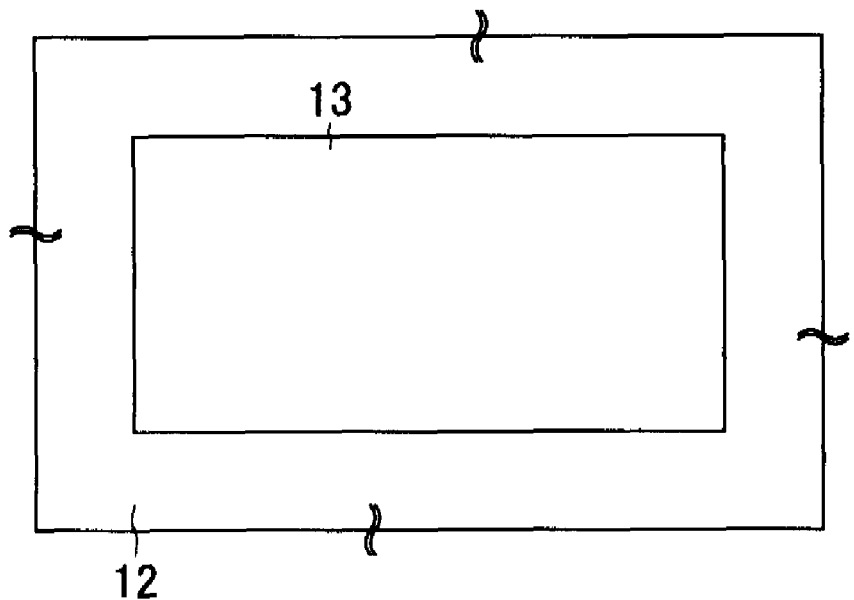
FIG. 2B is a schematic top plan view for showing a process for manufacturing the semiconductor device 10 according to the present embodiment (specifically forming STI 12 and active regions 13)

FIG. 2A to FIG. 24B are process diagrams for explaining a method of manufacturing the semiconductor device 10 according to the present embodiment, wherein FIG. 2A is a cross-sectional view and FIG. 2B is a top plan view.

In manufacturing the semiconductor device 10, the silicon substrate 11 is first prepared, and the STI 12 is formed on the silicon substrate 10, thereby forming an active region 13 encircled by the STI 12 (FIGS. 2A and 2B). While many active regions are actually formed on the silicon substrate 11, only one active region is shown in FIGS. 2A and 2B. While not particularly limited, the active region 13 has a rectangular shape in the present embodiment.

In forming the STI 12, a trench having a depth of about 220 nm is formed on the main surface of the silicon substrate 11 by dry etching, and a thin silicon oxide film is formed by thermal oxidation at about 100° C. on the entire surface of the substrate including the inner wall of the trench. Thereafter, a silicon oxide film having a thickness of 400 to 500 nm is deposited on the entire surface of the substrate including the inside of the trench, by the CVD (Chemical Vapor Deposition) method. Thereafter, an unnecessary silicon oxide film on the silicon substrate 11 is removed by CMP (Chemical Mechanical Polishing), and the silicon oxide film is left only within the trench, thereby forming the STI 12.

Figure 3A:
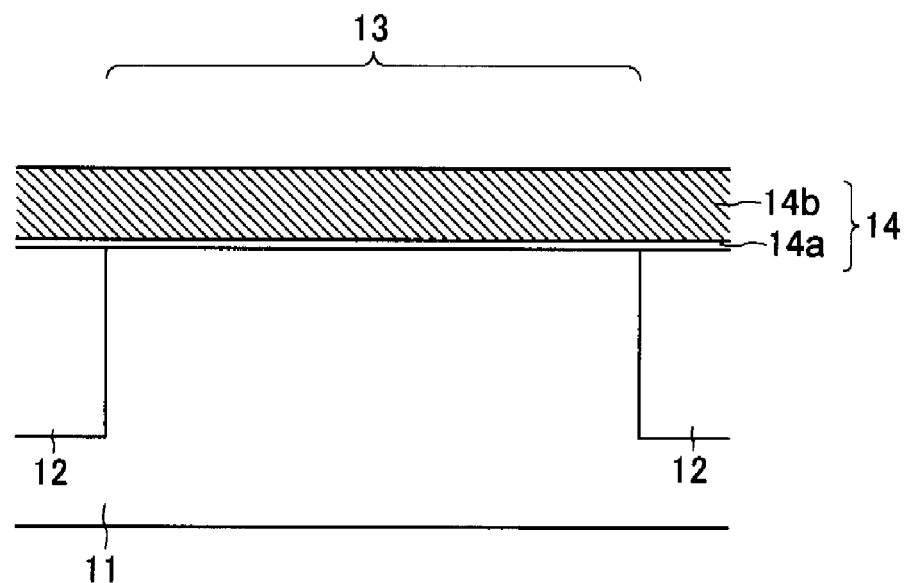
FIG. 3A is a schematic cross-sectional view showing a process for manufacturing the semiconductor device 10 according to the present embodiment (specifically forming a hardmask 14)
Figure 3B:
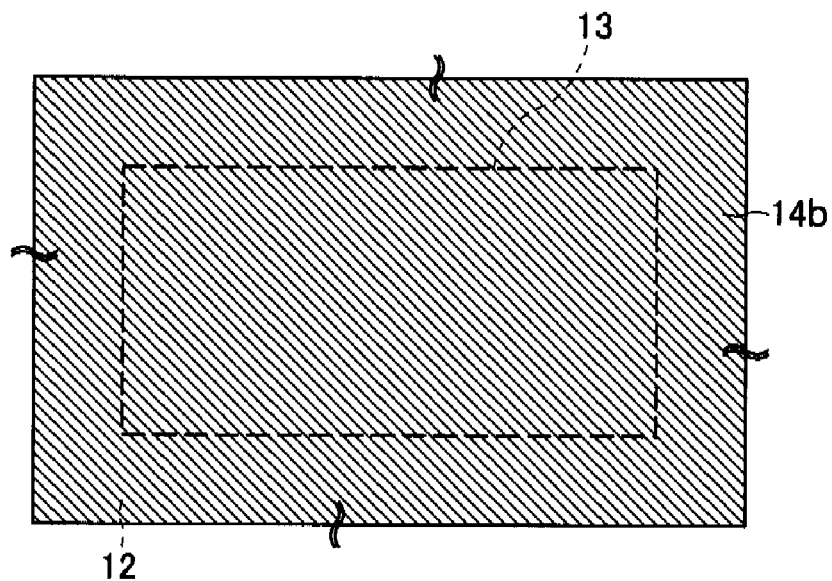
FIG. 3B is a schematic top plan view for showing a process for manufacturing the semiconductor device 10 according to the present embodiment (specifically forming a hardmask 14)

Next, the first and second silicon pillars 15A and 15B are formed simultaneously within the active region 13. In forming the silicon pillars 15A and 15B, the silicon oxide film 14a as a protection insulation film and the silicon nitride film 14b as a hardmask are formed on the entire surface of the substrate (FIGS. 3A and 3B). While not particularly limited, the silicon oxide film 14a and the silicon nitride film 14b can be formed by the CVD method. Preferably, the silicon oxide film 14a has a thickness of about 5 nm, and the silicon nitride film 14b has a thickness of about 120 nm. In the present specification, a lamination film of the silicon nitride film 14a and the silicon nitride film 14b is also simply called a "hardmask 14".

Figure 4A:
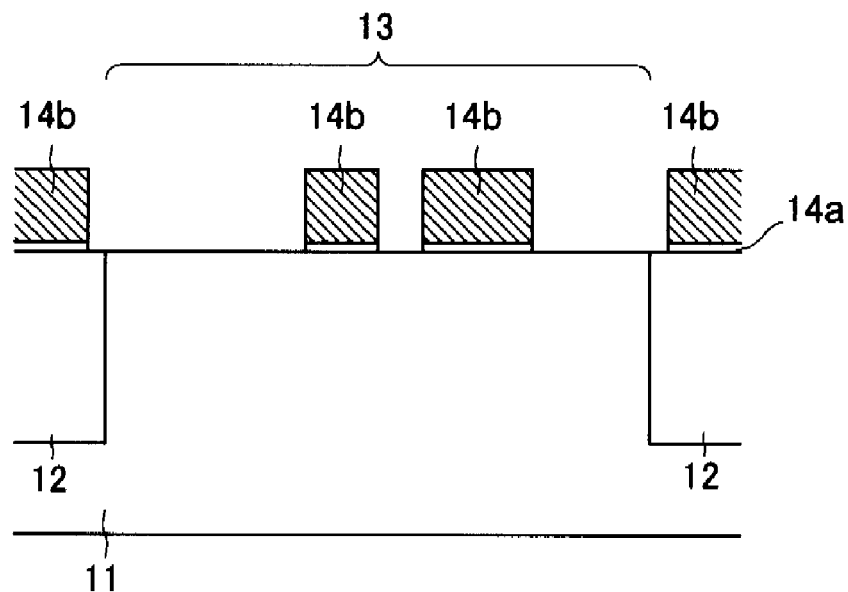
FIG. 4A is a schematic cross-sectional view showing a process for manufacturing the semiconductor device 10 according to the present embodiment (specifically patterning the hardmask 14)
Figure 4B:
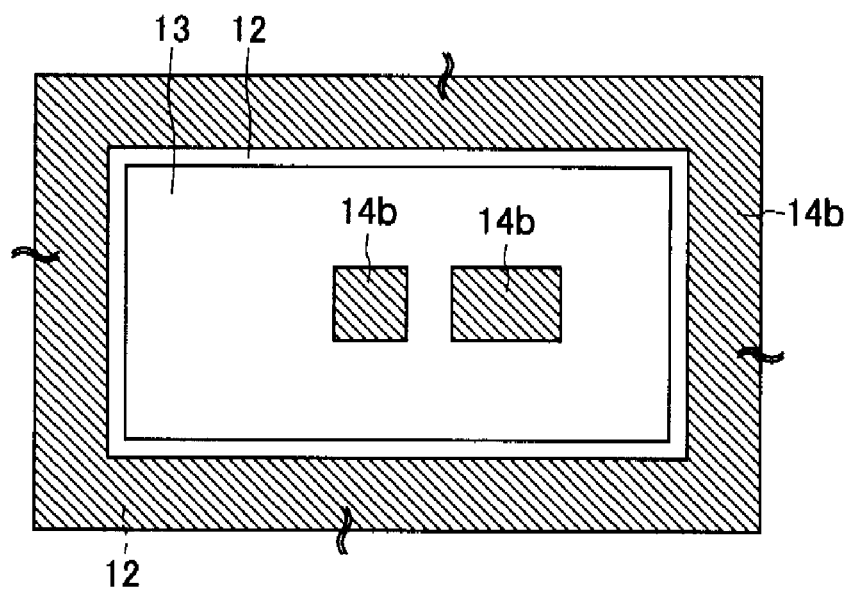
FIG. 4B is a schematic top plan view for showing a process for manufacturing the semiconductor device 10 according to the present embodiment (specifically patterning the hardmask 14)

Thereafter, the hardmask 14 is patterned, thereby leaving the hardmask 14 in the region in which the first and second silicon pillars 15A and 15B are to be formed and in the region at the outside of the active region 13, and removing other regions (FIGS. 4A and 4B). The edge of the hardmask 14 covering the STI 12 is preferably positioned at the outside of the external periphery of the active region 13 to avoid forming an unnecessary silicon pillar within the active region 13.

Figure 5:
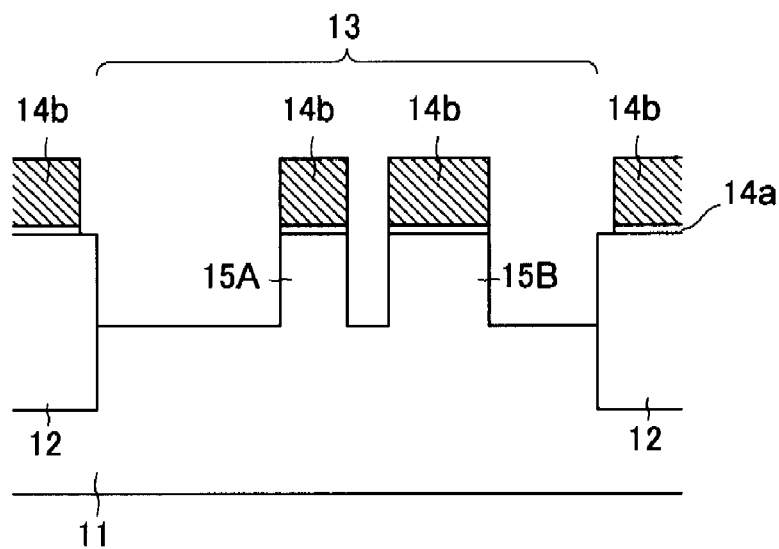
FIG. 5 is a schematic cross-sectional view showing a process for manufacturing the semiconductor device 10 according to the present embodiment (specifically forming silicon pillars 15a, 15b)

Further, the exposed surface of the active region 13 is etched by dry etching, using the hardmask 14 patterned in this way (FIG. 5). By this etching process, a recess is shaped on the exposed surface of the active region 13, and parts not etched become the first and second silicon pillars 15A and 15B substantially perpendicular to the main surface of the silicon substrate. The hardmask 14 remaining on the upper part of the silicon pillars 15A and 15B become cap insulation films.

Figure 6:
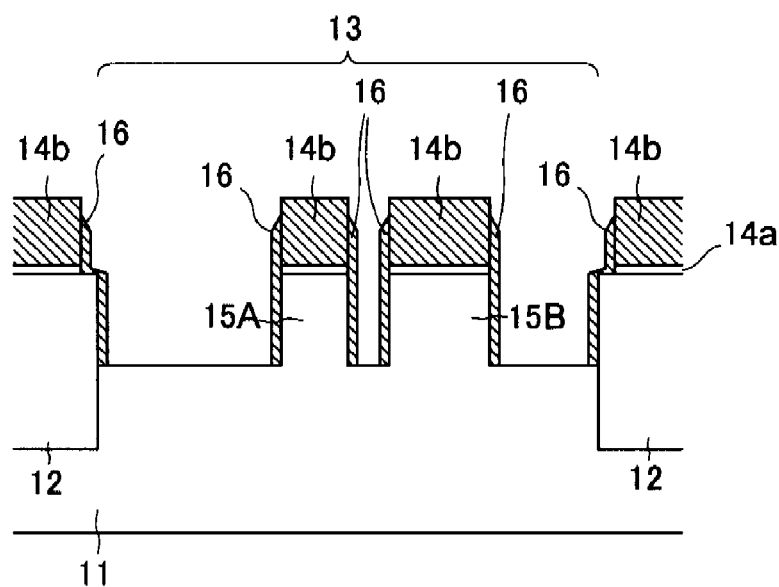
FIG. 6 is a schematic cross-sectional view showing a process for manufacturing the semiconductor device 10 according to the present embodiment (specifically forming sidewall insulation film 16)

Next, a sidewall insulation film 16 is formed on the side surfaces of the first and second silicon pillars 15A and 15B (FIG. 6). The sidewall insulation film 16 can be formed by protecting the exposed surface of the active region 13 thermal oxidation without removing the hardmask 14, then forming a silicon nitride film, and etching back this silicon nitride film. Accordingly, the internal peripheral surface of the active region 13 and the side surfaces of the first and second silicon pillars 15A and 15B become in the state of being covered by the sidewall insulation film 16.

Figure 7:
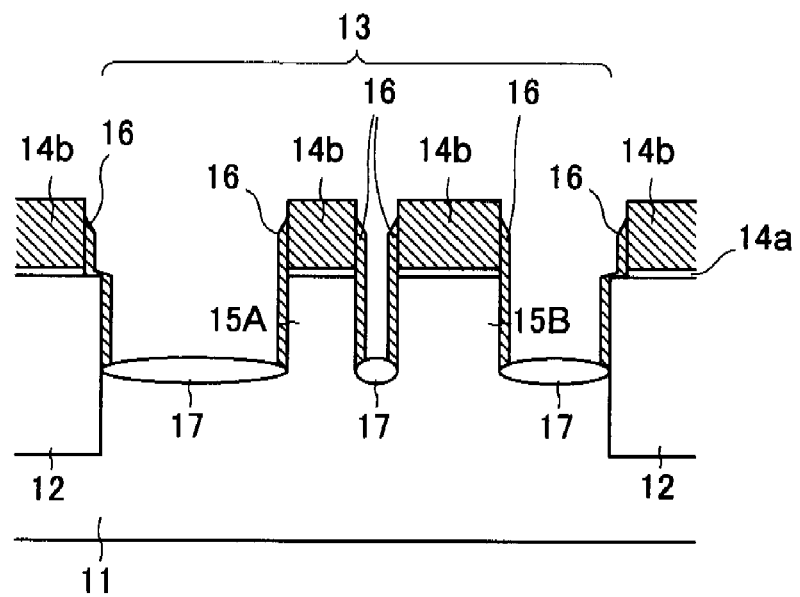
FIG. 7 is a schematic cross-sectional view showing a process for manufacturing the semiconductor device 10 according to the present embodiment (specifically forming silicon oxide film 17)

Next, a silicon oxide film 17 is formed by thermal oxidation on the exposed surface of the active region 13 (that is, the bottom surface of the active region 13) (FIG. 7). In this case, the upper surfaces and the side surfaces of the first and second silicon pillars 15A and 15B are covered by the hardmask 14 and the sidewall insulation film 16, respectively, and therefore are not thermally oxidized. While not particularly limited, preferably, a thickness of the silicon oxide film 17 is about 30 nm.

Figure 8:
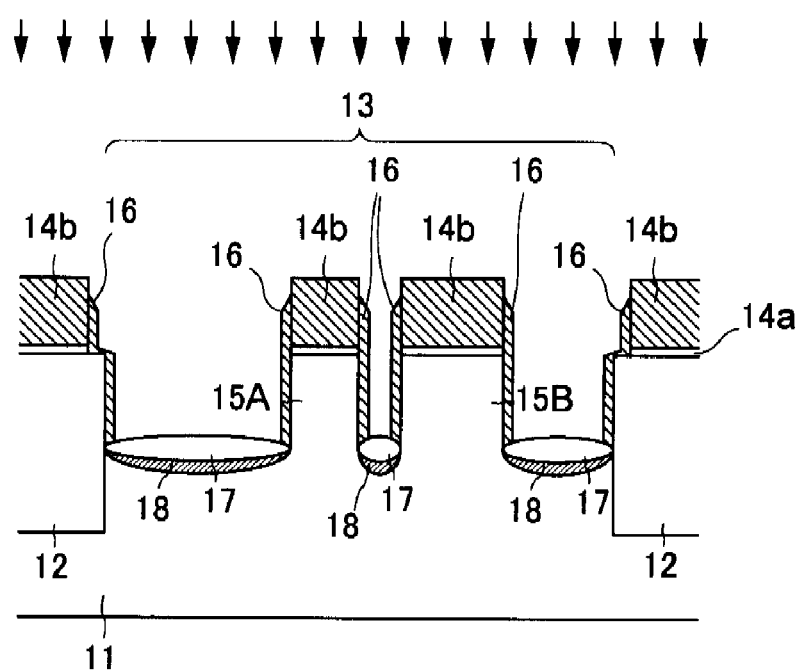
FIG. 8 is a schematic cross-sectional view showing a process for manufacturing the semiconductor device 10 according to the present embodiment (specifically forming first diffusion layer 18)

Next, the first diffusion layer 18 is formed at the lower parts of the first and second silicon pillars 15A and 15B, respectively (FIG. 8). The first diffusion layer 18 can be formed by ion-implanting an impurity having conductivity type opposite to that of the impurity in the silicon substrate, via the silicon oxide film 17 formed on the surface of the active region 13.

Figure 9:
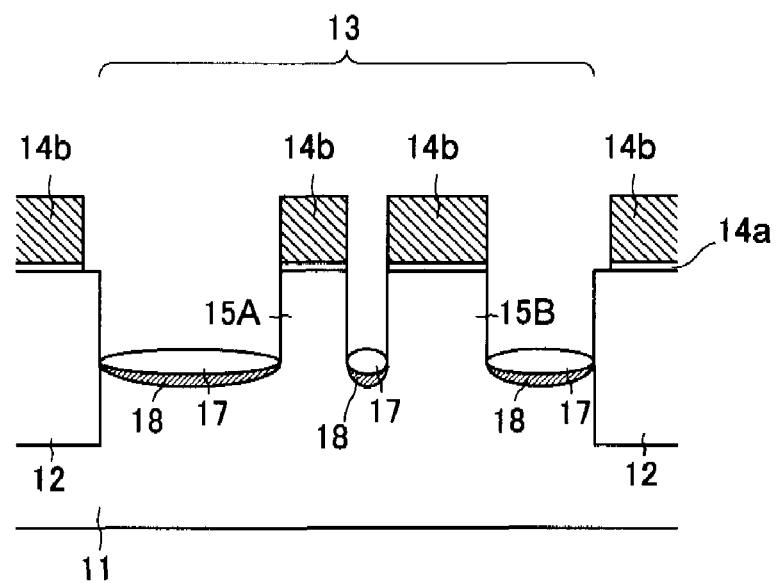
FIG. 9 is a schematic cross-sectional view showing a process for manufacturing the semiconductor device 10 according to the present embodiment (specifically removing the sidewall insulation film 16)

Next, the sidewall insulation film 16 is removed by wet etching (FIG. 9). As a result, the silicon oxide film 17 formed on the bottom surface of the active region 13 and the side surfaces of the first and second silicon pillars 15A and 15B become in the exposed state. The upper surfaces of the first and second silicon pillars 15A and 15B are kept covered by the hardmask 14 as a cap insulation film.

Figure 10:
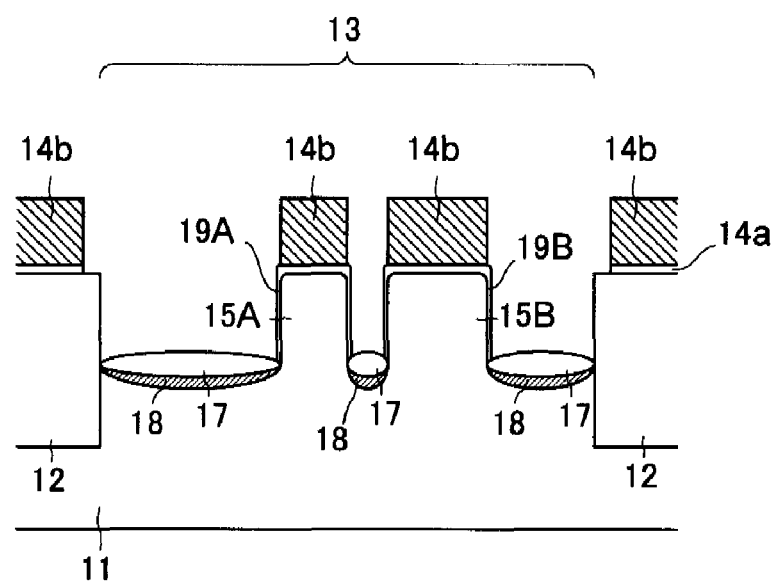
FIG. 10 is a schematic cross-sectional view showing a process for manufacturing the semiconductor device 10 according to the present embodiment (specifically forming gate insulation films 19A, 19B)
Figure 11:
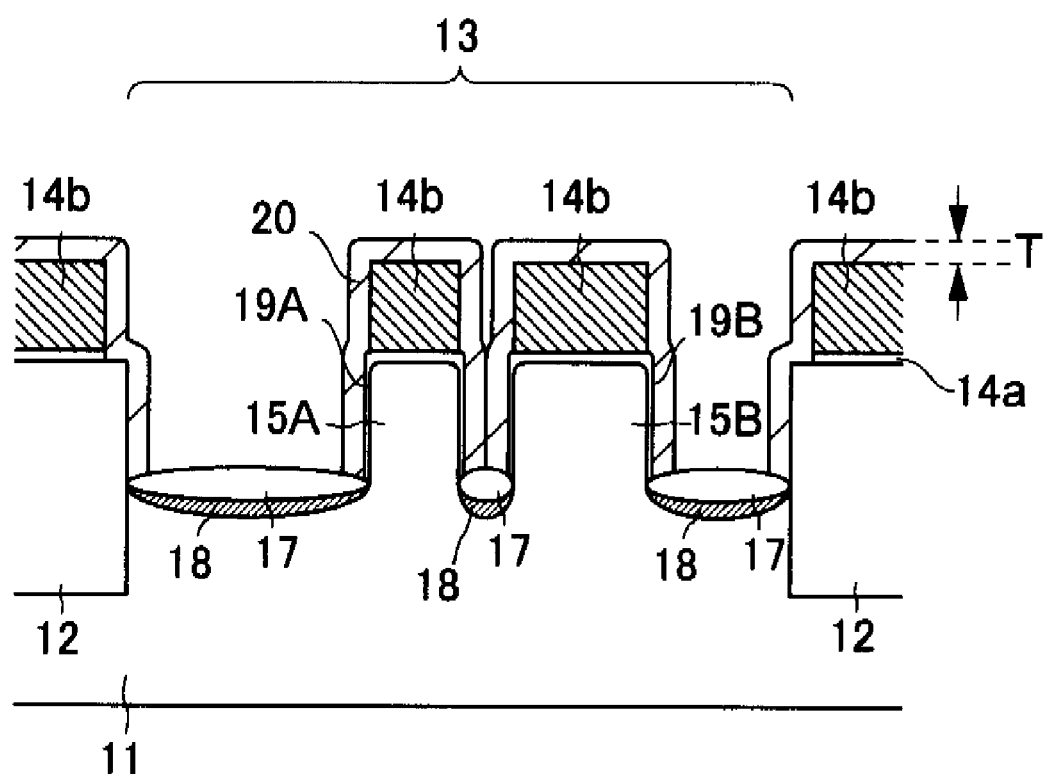
FIG. 11 is a schematic cross-sectional view showing a process for manufacturing the semiconductor device 10 according to the present embodiment (specifically forming a polycrystalline silicon film)

Next, the gate insulation films 19A and 19B are then simultaneously formed on the side surfaces of the first and second silicon pillars 15A and 15B with remaining the hardmask 14 (FIG. 10). The gate insulation films 19A and 19B can be formed by thermal oxidation, and, preferably, their thicknesses are about 5 nm.

Figure 12A:
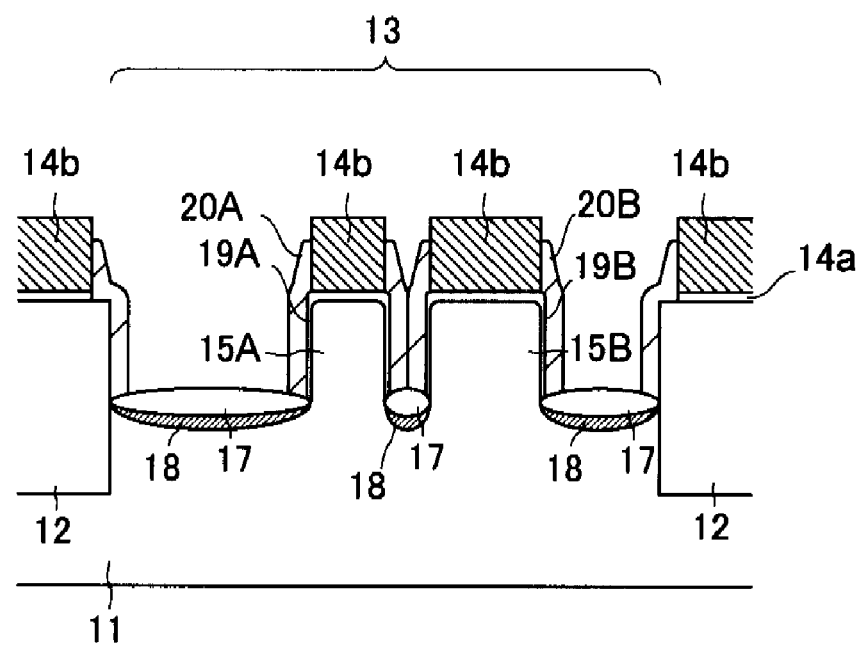
FIG. 12A is a schematic cross-sectional view showing a process for manufacturing the semiconductor device 10 according to the present embodiment (specifically etching back the polycrystalline silicon film)
Figure 12B:
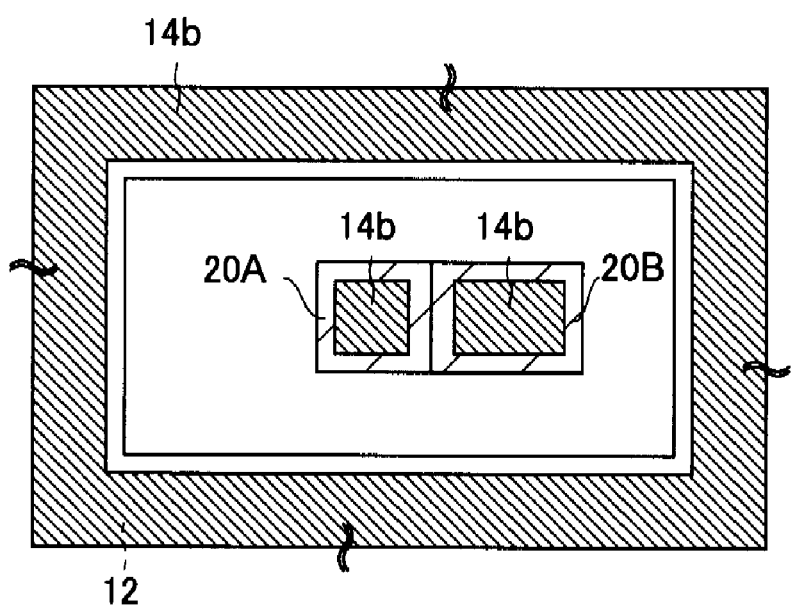
FIG. 12B is a schematic plan view showing a process for manufacturing the semiconductor device 10 according to the present embodiment (specifically etching back the polycrystalline silicon film)

Next, the gate electrodes 20A and 20B made of a polycrystalline silicon film are formed. The gate electrodes 20A and 20B can be formed by forming the polycrystalline silicon film 20 having a thickness T of about 30 nm on the entire surface of the substrate by the CVD method with remaining the hardmask 14 (FIG. 11), and then etching back the polycrystalline silicon film (FIGS. 12A and 12B). Consequently, the side surface of the silicon pillar 15A becomes in the state of being covered by the first gate electrode 20A, and the side surface of the silicon pillar 15B becomes in the state of being covered by the second gate electrode 20B. While the polycrystalline silicon film also remains on the side surface of the STI 12, this polycrystalline silicon film does not function as a gate electrode. Further, since the distance L between the first and second silicon pillars 15A and 15B is set smaller than two times the thickness T of the gate electrode 20, the gate electrodes 20A and 20B formed in the gap between the first silicon pillar 15A and the second silicon pillar 15B are in contact with each other.

Figure 13:
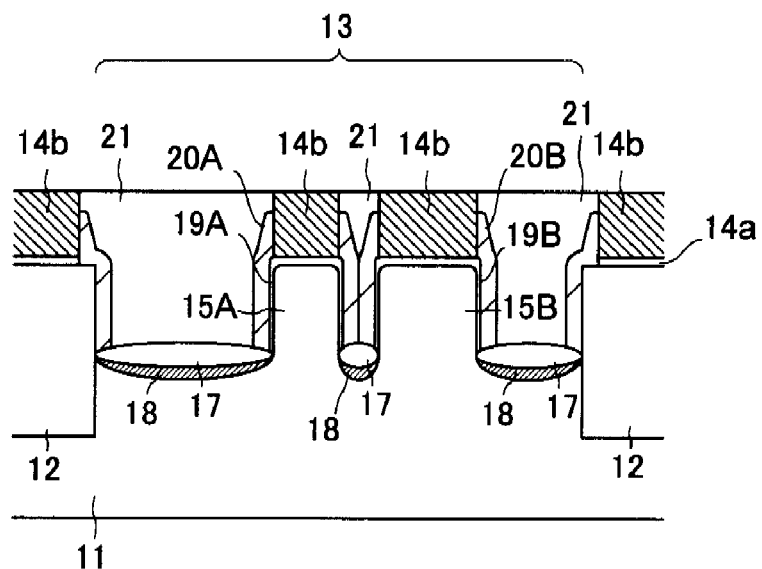
FIG. 13 is a schematic cross-sectional view showing a process for manufacturing the semiconductor device 10 according to the present embodiment (specifically forming an interlayer insulation film 21)

Next, the interlayer insulation film 21 including a silicon oxide film is formed on the entire surface of the substrate, and then the entire surface of the interlayer insulation film 21 is planarized by the CMP method (FIG. 13). In this case, the silicon nitride film 14b serves as a CMP stopper. Therefore, the thickness of the interlayer insulation film 21 can be securely controlled. As a result, the active region 13 becomes in the state of being embedded by the interlayer insulation film 21.

Figure 14:
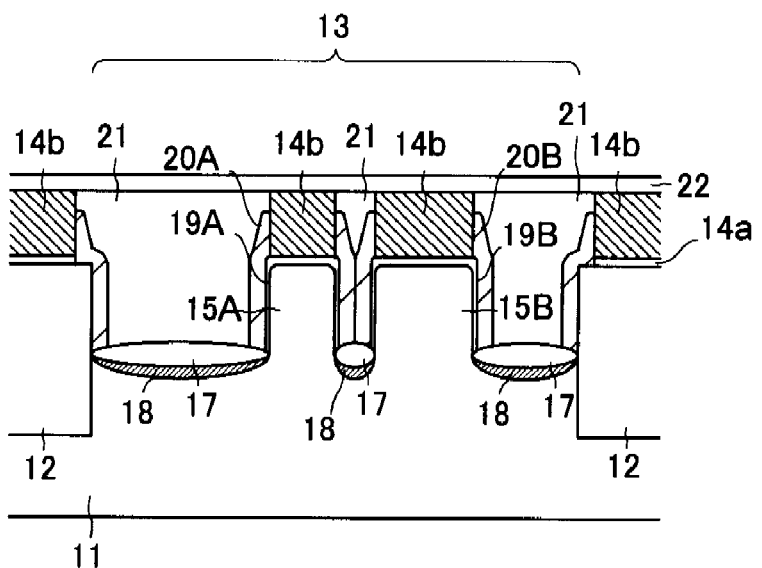
FIG. 14 is a schematic cross-sectional view showing a process for manufacturing the semiconductor device 10 according to the present embodiment (specifically forming a mask oxide film 22)
Figure 15A:
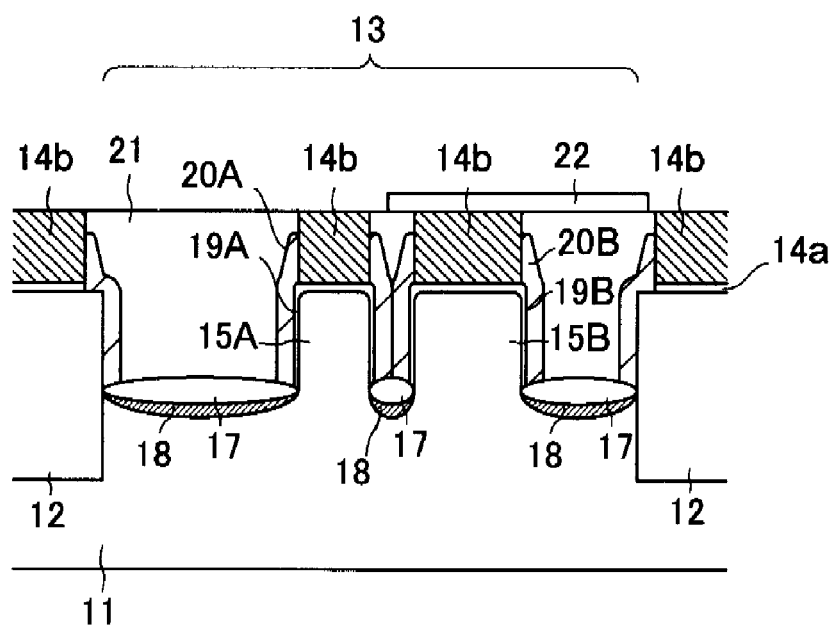
FIG. 15A is a schematic cross-sectional view showing a process for manufacturing the semiconductor device 10 according to the present embodiment (specifically patterning the mask oxide film 22)
Figure 15B:
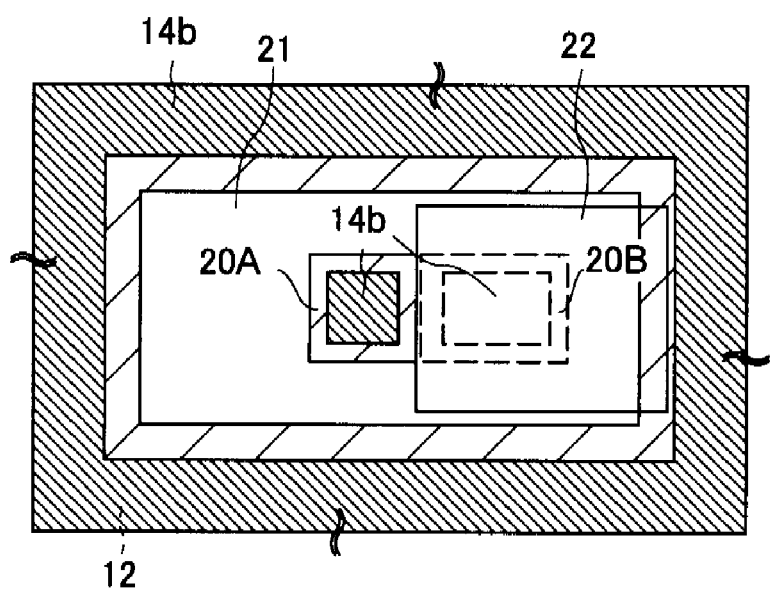
FIG. 15B is a schematic plan view showing a process for manufacturing the semiconductor device 10 according to the present embodiment (specifically patterning the mask oxide film 22)
Figure 16A:
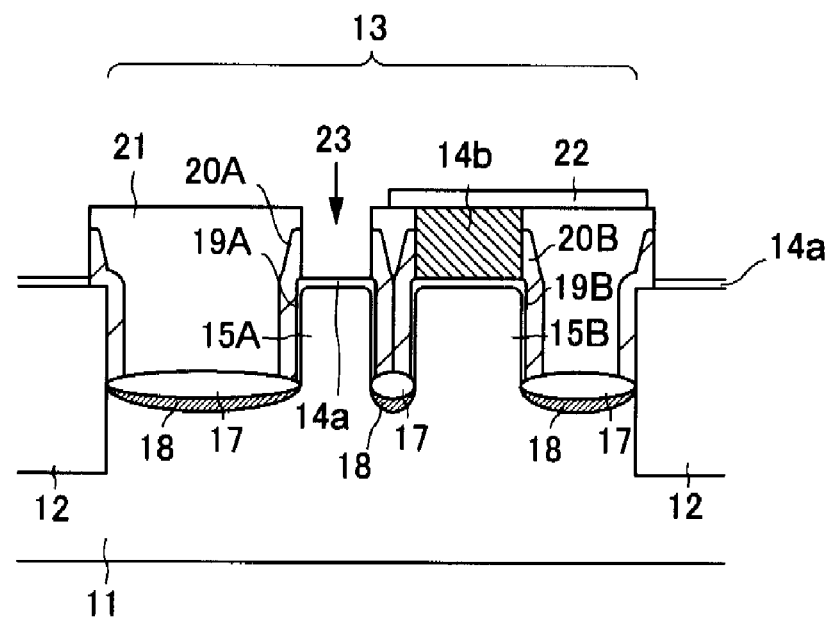
FIG. 16A is a schematic cross-sectional view showing a process for manufacturing the semiconductor device 10 according to the present embodiment (specifically removing a silicon nitride film 14b)
Figure 16B:
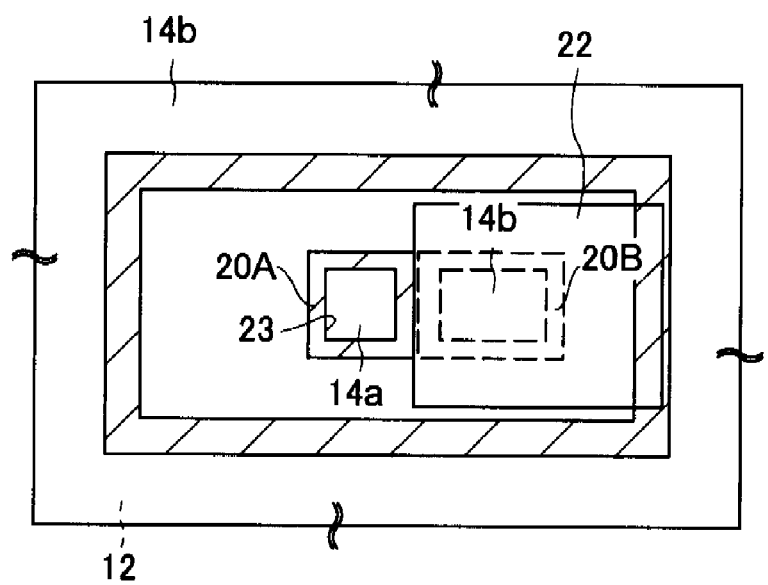
FIG. 16B is a schematic plan view showing a process for manufacturing the semiconductor device 10 according to the present embodiment (specifically removing a silicon nitride film 14b)

Next, the hardmask 14 provided above the silicon pillar 15A is selectively removed, thereby forming the through-hole (opening) 23. In forming the through-hole 23, a mask oxide film 22 including a silicon oxide film is first formed on the entire surface of the substrate (FIG. 14). The mask oxide film 22 can be formed by the CVD method. Preferably, a thickness of the mask oxide film 22 is about 5 nm. Next, the mask oxide film 22 is patterned so that the silicon nitride film 14b formed above the first silicon pillar 15A is exposed and the silicon nitride film (cap insulation film) 14b above the second silicon pillar 15B is protected (FIGS. 15A and 15B). Thereafter, the exposed silicon nitride film 14b is removed by dry etching or wet etching, thereby forming the through-hole 23 having the silicon oxide film 14a as a bottom surface (FIGS. 16A and 16B).

The through-hole 23 is formed by removing the silicon nitride film 14b used as a mask to form the silicon pillar 15A, and is, therefore, formed in self-alignment to the silicon pillar 15A. Consequently, the inner wall surface of the through-hole 23 and the external periphery of the silicon pillar 15A are on the same surface.

Figure 17:
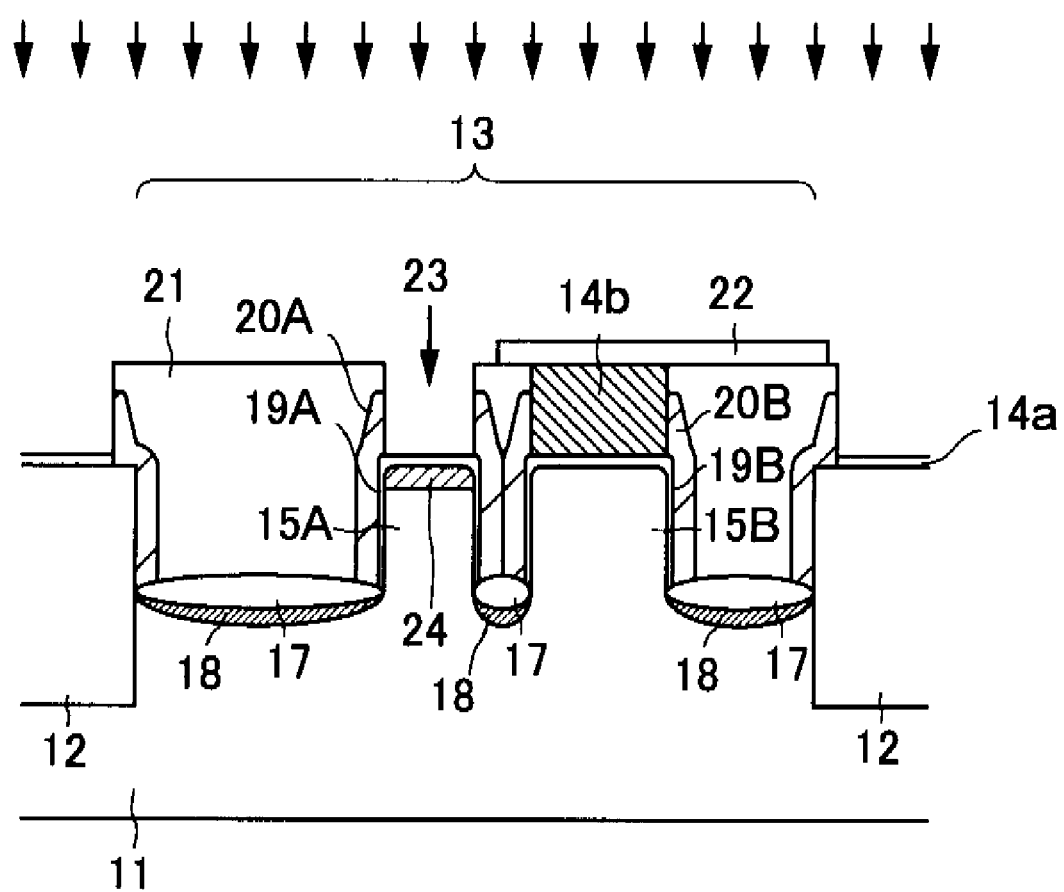
FIG. 17 is a schematic cross-sectional view showing a process for manufacturing the semiconductor device 10 according to the present embodiment (specifically forming LDD region 24)

Next, the LDD region 24 is formed on the upper part of the first silicon pillar 15A (FIG. 17). The LDD region 24 can be formed by shallowly ion-implanting an impurity of low concentration having conductivity type opposite to the impurity in the silicon substrate, via the silicon oxide film 14a formed on the upper part of the first silicon pillar 15A.

Figure 18A:
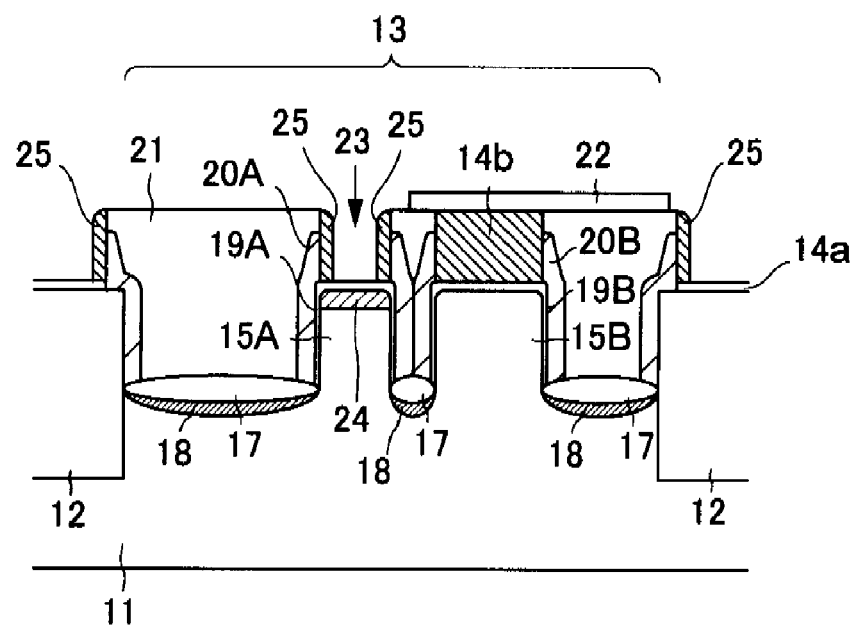
FIG. 18A is a schematic cross-sectional view showing a process for manufacturing the semiconductor device 10 according to the present embodiment (specifically forming sidewall insulation film 25)
Figure 18B:
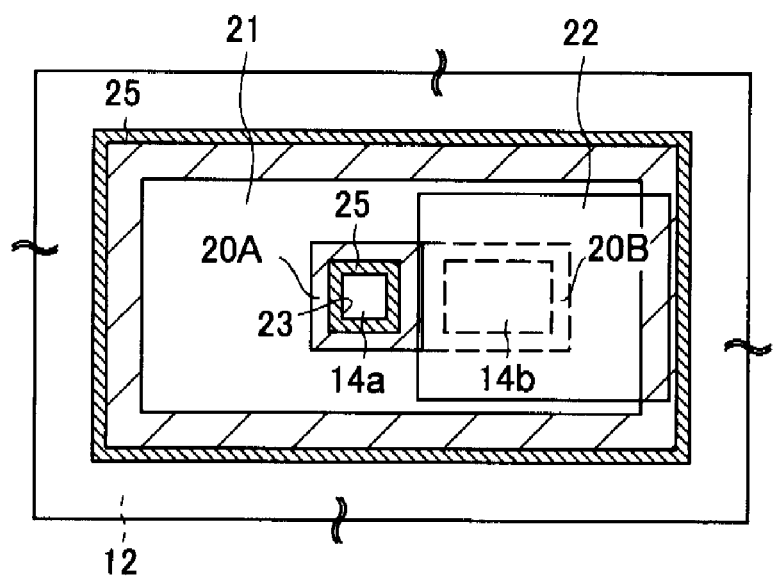
FIG. 18B is a schematic plan view showing a process for manufacturing the semiconductor device 10 according to the present embodiment (specifically forming sidewall insulation film 25)

Next, the sidewall insulation film 25 is formed on the inner wall surface of the through-hole 23 (FIG. 18). The sidewall insulation film 25 can be formed by forming a silicon nitride film on the entire surface of the substrate, and then etching back the silicon nitride film. While not particularly limited, preferably, a thickness of the silicon nitride film is about 10 nm. In this way, the sidewall insulation film 25 is formed on the inner wall surface of the through-hole 23, and the through-hole 23 is formed by removing the silicon nitride film 14b as a hardmask used to form the silicon pillar 15A. Therefore, the position of the external periphery of the cylindrical sidewall insulation film 25 and the position of the external periphery of the silicon pillar 15A coincides with each other. While the silicon nitride film is also formed on the external periphery of the active region 13, this silicon nitride film does not function as a sidewall insulation film.

Figure 19A:
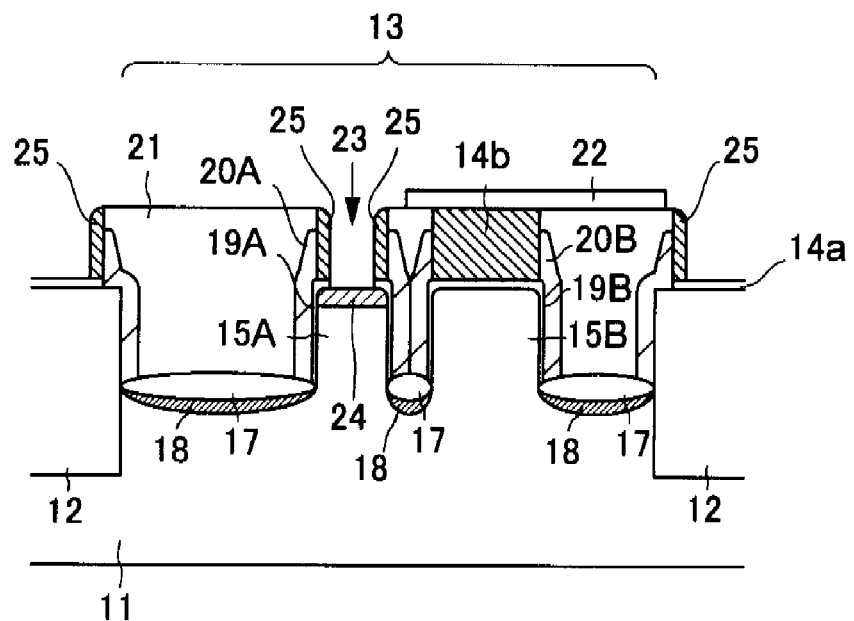
FIG. 19A is a schematic cross-sectional view showing a process for manufacturing the semiconductor device 10 according to the present embodiment (specifically forming an opening)
Figure 19B:
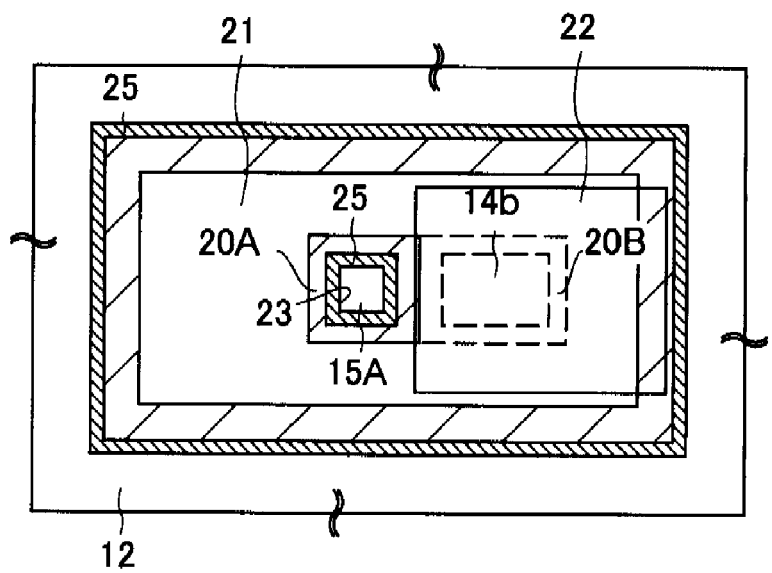
FIG. 19B is a schematic plan view showing a process for manufacturing the semiconductor device 10 according to the present embodiment (specifically forming an opening)
Figure 20A:
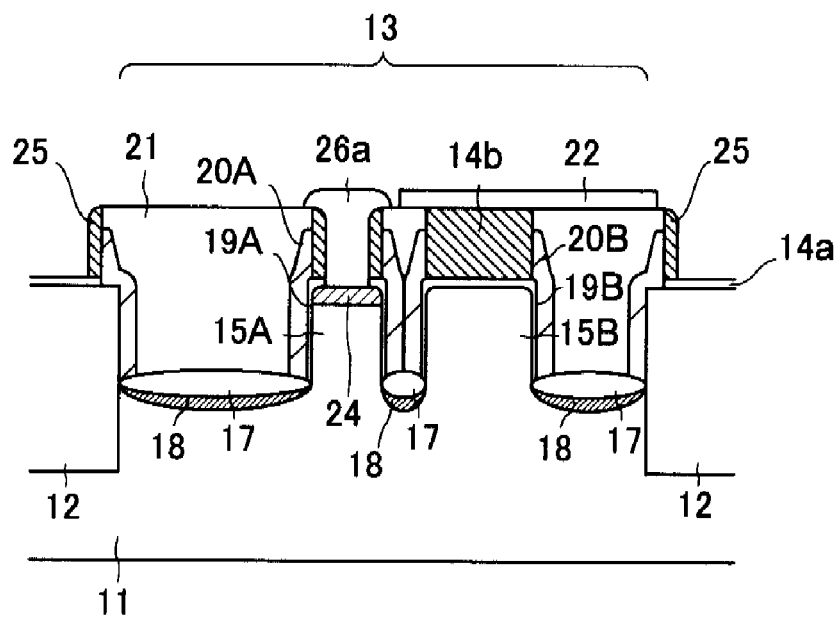
FIG. 20A is a schematic cross-sectional view showing a process for manufacturing the semiconductor device 10 according to the present embodiment (specifically forming a silicon epitaxial layer 26*a*)
Figure 20B:
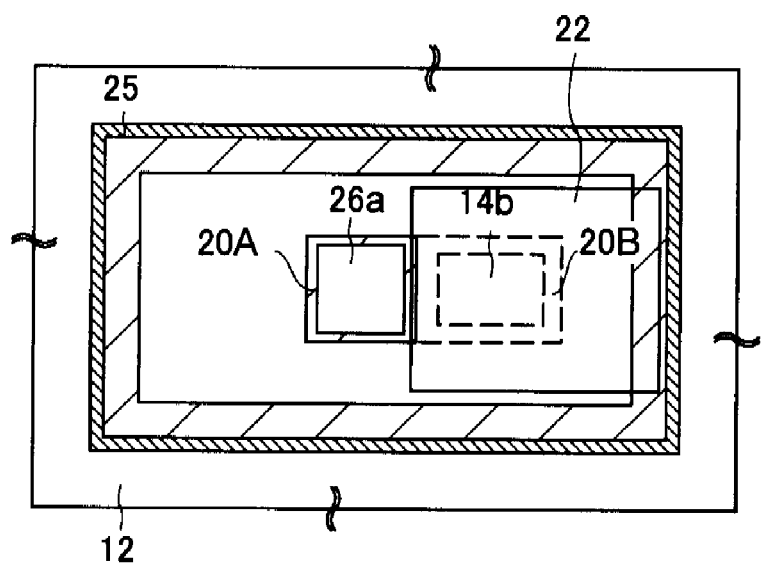
FIG. 20B is a schematic plan view showing a process for manufacturing the semiconductor device 10 according to the present embodiment (specifically forming a silicon epitaxial layer 26*a*)
Figure 21A:
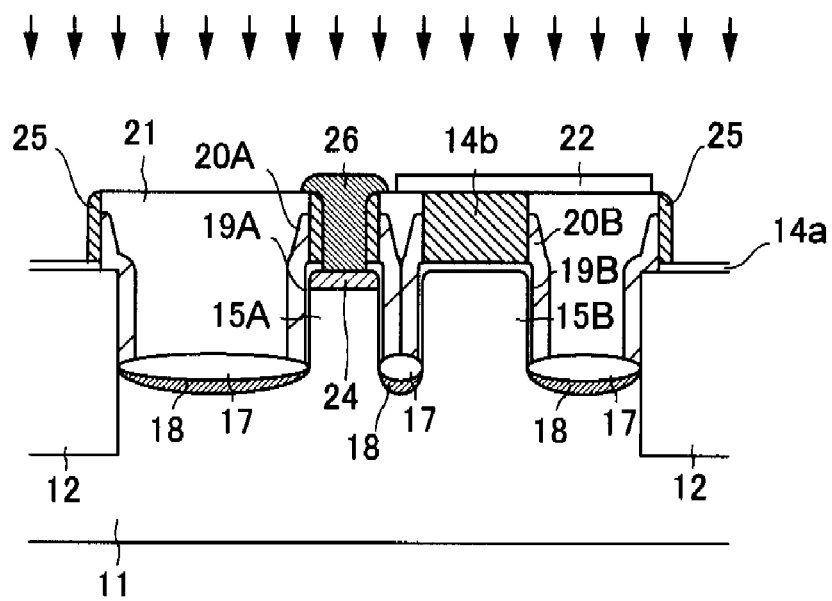
FIG. 21A is a schematic cross-sectional view showing a process for manufacturing the semiconductor device 10 according to the present embodiment (specifically forming second diffusion layer 26)
Figure 21B:
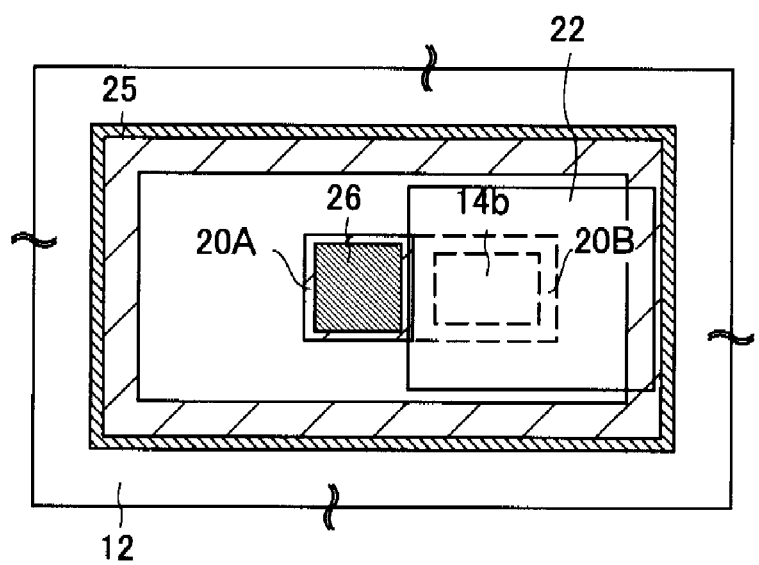
FIG. 21B is a schematic plan view showing a process for manufacturing the semiconductor device 10 according to the present embodiment (specifically forming second diffusion layer 26)
Figure 22:
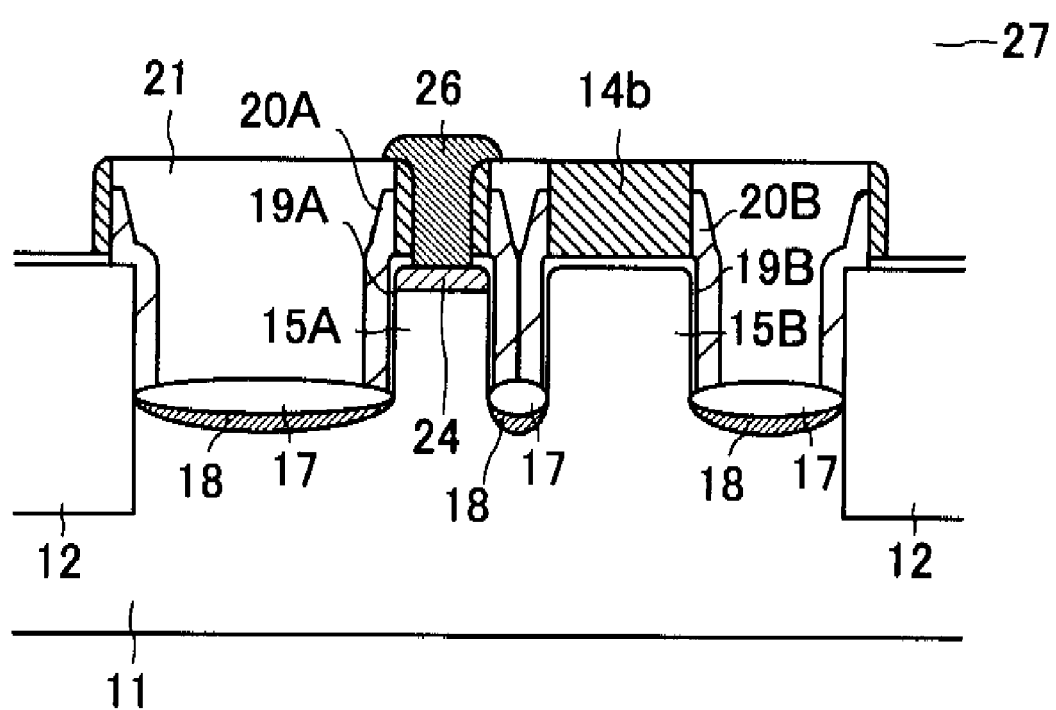
FIG. 22 is a schematic cross-sectional view showing a process for manufacturing the semiconductor device 10 according to the present embodiment (specifically forming interlayer insulating layer 27)

Next, the second diffusion layer 26 is formed on the upper part of the first silicon pillar 15A. In forming the second diffusion layer 26, an opening is formed on the silicon oxide film 14a at the bottom surface of the through-hole, thereby exposing the upper surface of the first silicon pillar 15A (FIGS. 19A and 19B). A silicon epitaxial layer 26a is formed inside the through-hole 23 by a selective epitaxial growth method (FIGS. 20A and 20B). A monocrystalline silicon therefore grows. Thereafter, an impurity of high concentration having conductivity type opposite to that of the impurity in the silicon substrate is ion-implanted into the silicon epitaxial layer 26a, thereby forming the second diffusion layer 26 (FIGS. 21A and 21B). As a result, the second diffusion layer 26 is formed in self-alignment to the first silicon pillar 15A.

Figure 23A:
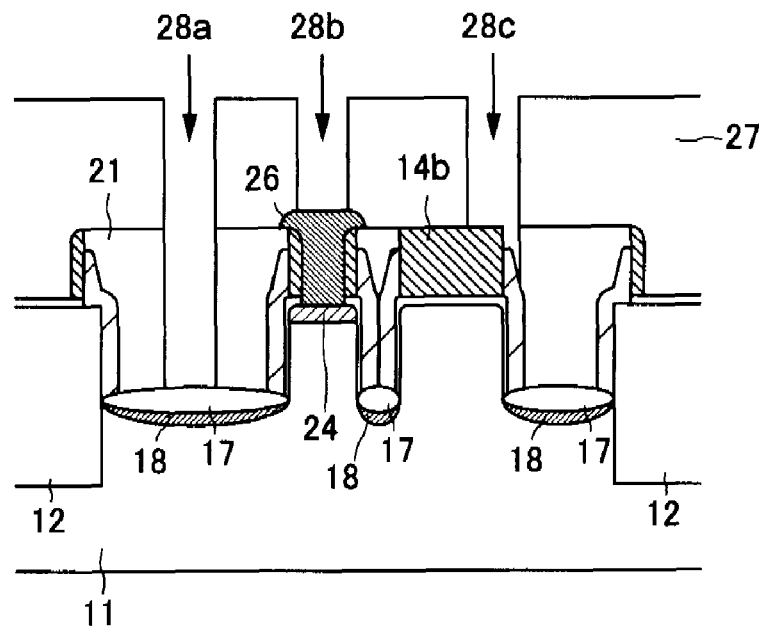
FIG. 23A is a schematic cross-sectional view showing a process for manufacturing the semiconductor device 10 according to the present embodiment (specifically forming contact-holes 28*a* to 28*c*)
Figure 23B:
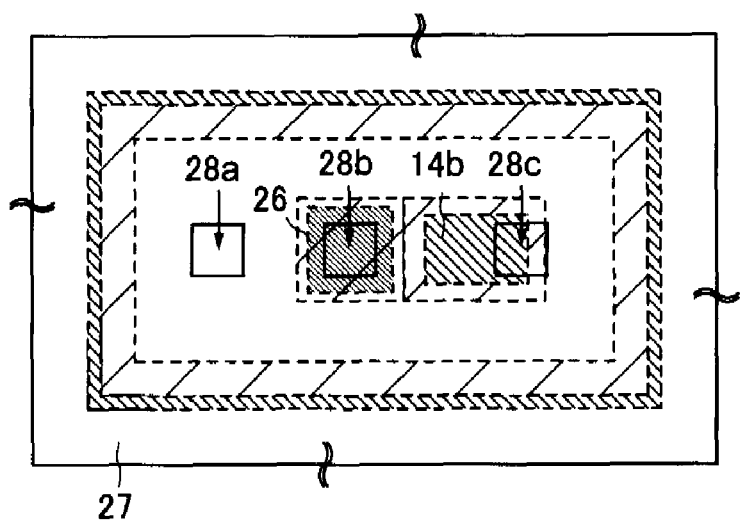
FIG. 23B is a schematic plan view showing a process for manufacturing the semiconductor device 10 according to the present embodiment (specifically forming contact-holes 28*a* to 28*c*)

Next, the interlayer insulation film 27 is formed on the entire surface of the substrate (FIG. 22), and then a first to third contact-holes 28a to 28c are formed by patterning (FIGS. 23A and 23B). The first contact-hole 28a is formed in a vacant region within the active region 13 provided adjacent to the first silicon pillar 15A, and reaches the first diffusion layer 18 piercing through the interlayer insulation films 27, 21, and 17. The second contact-hole 28b is formed right above the first silicon pillar 15A, and reaches the second diffusion layer 26 piercing through the interlayer insulation film 27. The third contact-hole 28c is formed above the second silicon pillar 15A, not right above the second silicon pillar 15A, and reaches the second gate electrode 20B piercing through the interlayer insulation films 27 and 21. Particularly, the third contact-hole 28c is preferably connected to a position opposite to the position of connection with the first gate electrode 20A, out of the second gate electrode 20B formed around the second silicon pillar 15B. According to this structure, an interval between the second contact-hole 28b and the third contact-hole 28c can be increased. Therefore, sufficient margin can be secured.

Figure 24A:
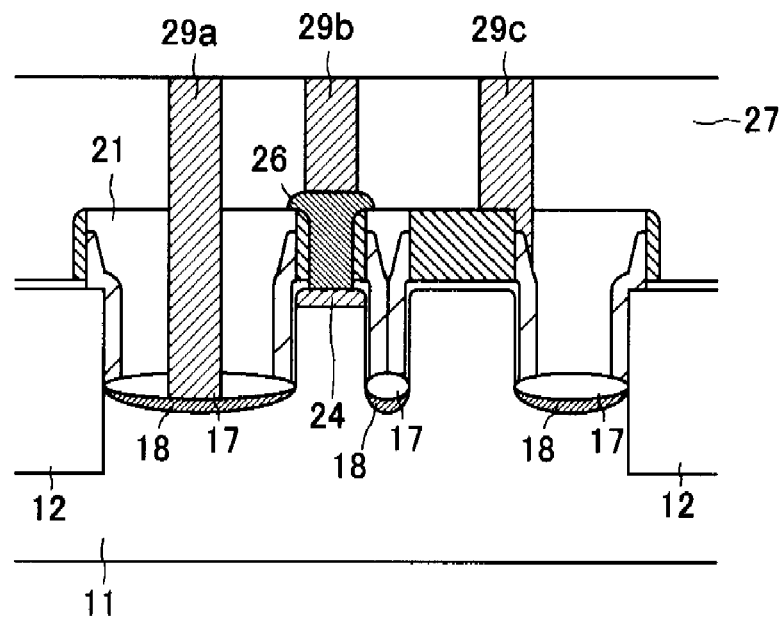
FIG. 24A is a schematic cross-sectional view showing a process for manufacturing the semiconductor device 10 according to the present embodiment (specifically forming contact-plugs 29*a* to 29*c*)
Figure 24B:
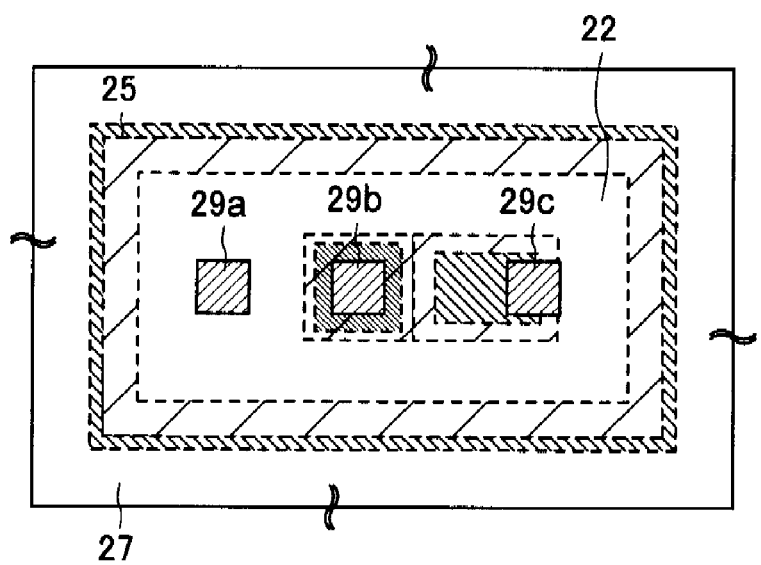
FIG. 24B is a schematic plan view showing a process for manufacturing the semiconductor device 10 according to the present embodiment (specifically forming contact-plugs 29*a* to 29*c*)

Next, polycrystalline silicon is filled into the first to third contact-holes 28a to 28c, thereby forming the first to third contact-plugs 29a to 29c (FIG. 24). The first contact-plug (the first diffusion layer contact) 29a is connected to the first diffusion layer 18, the second contact-plug (the second diffusion layer contact) 29b is connected to the second diffusion layer 26, and the third contact-plug (the gate contact) is connected to the second gate electrode 20B.

Finally, the wiring layer 30 is formed on the upper end part of the first to third contact-plugs 29a to 29c, thereby completing the semiconductor device 10 according to the present embodiment (FIGS. 1A and 1B).

As explained above, according to the method of manufacturing the semiconductor device 10 of the present embodiment, the first and second silicon pillars 15A and 15B are simultaneously formed using a hardmask. Therefore, the interval (distance L) between the two silicon pillars can be controlled in high precision, and the gate electrodes formed on the silicon pillars can be securely connected to each other. Consequently, the gate contact can be secured without performing photolithography to the first gate electrode 20A having a three-dimensional structure. The gate electrodes 20A and 20B are formed by leaving the hardmask 14 used to form the silicon pillars 15A and 15B, and then, the hardmask 14 on the first silicon pillar 15S is removed. Therefore, the through-hole 23 can be formed in self-alignment at the upper part of the first silicon pillar 15A. Consequently, by forming the second diffusion layer 26 within the through-hole 23, the second diffusion layer 26 can be formed in self-alignment to the first silicon pillar 15A.

Figure 25:
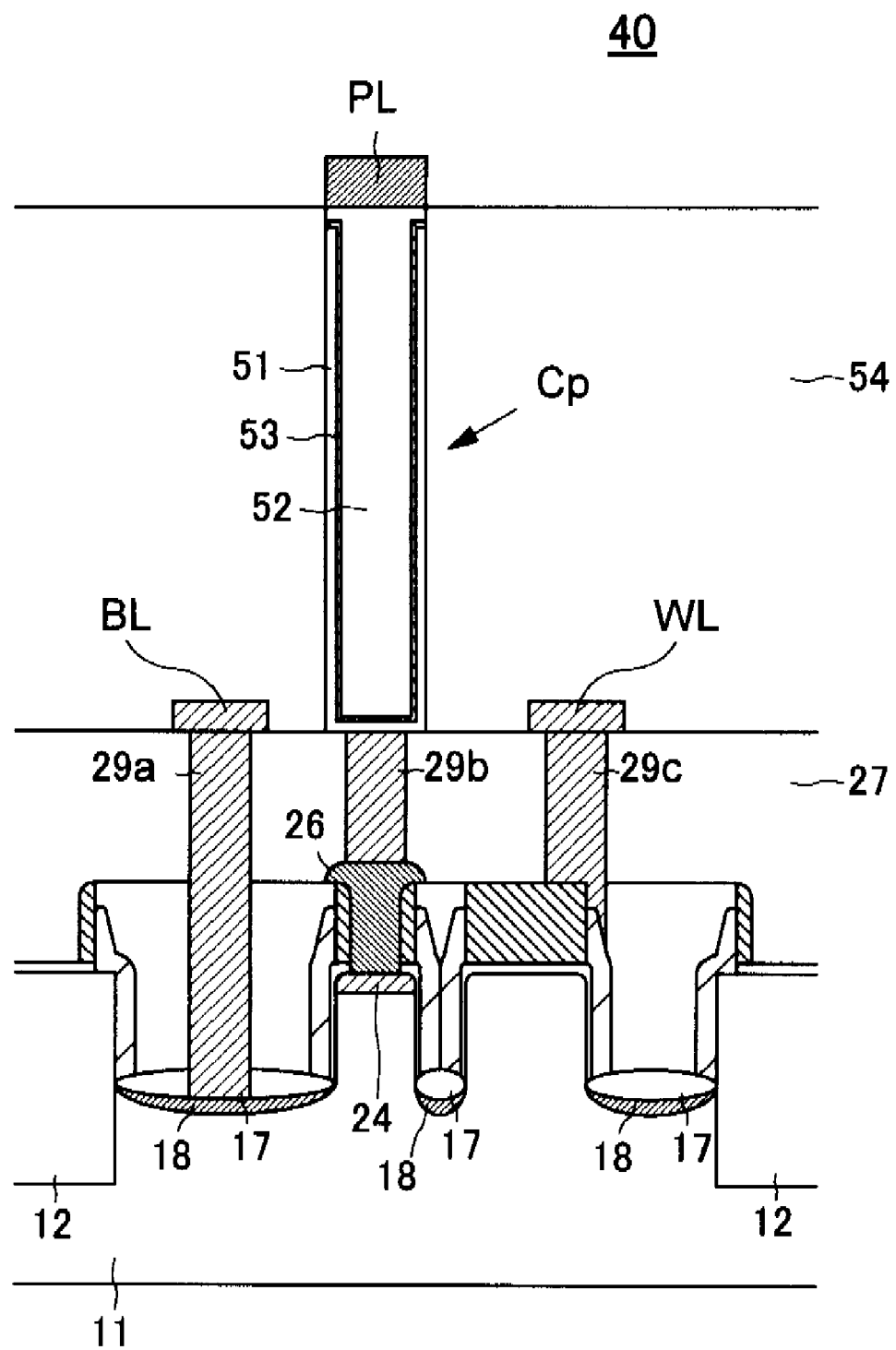
FIG. 25 is a schematic cross-sectional view showing a structure of a semiconductor device according to another preferred embodiment of the present invention.

FIG. 25 is a schematic cross-sectional view of a semiconductor device according to another preferred embodiment of the present invention.

As shown in FIG. 25, a semiconductor device 40 according to the present embodiment is a DRAM cell using a vertical transistor, and a cell capacitor Cp is formed above a cell transistor Tr. A configuration of the cell transistor is similar to that of the transistor shown in FIG. 1.

The capacitor Cp includes a cylinder-type lower electrode 51, a pillar-type upper electrode 52 connected to a reference potential wiring PL, and a capacitance insulation film 53 provided between the lower electrode 51 and the upper electrode 52. The lower electrode 51 is formed within a cylinder hole piercing through the interlayer insulation film 54, and is connected to the second diffusion layer 26 via the storage node contact 29b. A part of the wiring layer 30 connected to the first diffusion layer 18 is used as a bit line BL, and a part connected to the second gate electrode 20B is used as a word line WL.

As described above, according to the semiconductor device 40 of the present invention, a very compact DRAM cell using a vertical transistor can be realized.

The present invention has thus been shown and described with reference to specific embodiments. However, it should be noted that the present invention is in no way limited to the details of the described arrangements but changes and modifications may be made without departing from the scope of the appended claims.

For example, in the above embodiments, the first and second silicon pillars have approximately rectangular shapes. While both silicon pillars have similar flat shapes, the shapes are not limited to these in the present invention, and various shapes are considered. For example, silicon pillars having a strip shape in the flat surface direction can be used.

In the above embodiments, the silicon epitaxial layer 26a is formed within the through-hole, and ion-implantation into this silicon epitaxial layer 26a is performed, thereby forming the second diffusion layer 26. However, the present invention is not limited to this process. For example, a silicon film doped with an impurity can be embedded into the through-hole to form the second diffusion layer 26. However, when the selective epitaxial growth method is used, continuity of crystal can be secured, and more satisfactory transistor characteristic can be obtained. In the above embodiments, while the first silicon pillar 15A and the second diffusion layer 26 are configured by separate parts, the second diffusion layer 26 can be formed within the first silicon pillar 15A.

What is claimed is:

1. A semiconductor device comprising: first and second silicon pillars formed substantially perpendicularly to a main surface of a substrate; a gate electrode covering side surfaces of the first and second silicon pillars via a gate insulation film; first and second diffusion layers provided on a lower part and an upper part of the first silicon pillar, respectively; a cap insulation film substantially covering an upper part surface of the second silicon pillar; and a gate contact connected to the gate electrode, wherein the gate contact is connected to an upper region of the gate electrode provided at the periphery of the cap insulation film.

2. The semiconductor device as claimed in claim 1, wherein a distance between the first silicon pillar and the second silicon pillar is smaller than two times a film thickness of the gate electrode.

3. The semiconductor device as claimed in claim 1 further comprising first and second protection insulation films in contact with the upper surfaces of the first and second silicon pillars, respectively,
wherein the first protection insulation film has an opening to expose a part of upper surface of the first silicon pillar, and the second protection insulation film entirely covers the upper surface of the second silicon pillar.

4. The semiconductor device as claimed in claim 3, wherein the second diffusion layer is in contact with the upper surface of the first silicon pillar via the opening.

5. The semiconductor device as claimed in claim 4, further comprising a cylindrical sidewall insulation film intervening between the second diffusion layer and the gate electrode so as to insulate therebetween.

6. The semiconductor device as claimed in claim 5, wherein a planar position of an external periphery of the cylindrical sidewall insulation film and a planar position of an external periphery of the first silicon pillar substantially coincide with each other.

7. The semiconductor device as claimed in claim 1, wherein a planar area of the second silicon pillar is larger than a planar area of the first silicon pillar.

8. The semiconductor device as claimed in claim 1, wherein the cap insulation film is formed of an insulating material.

9. The semiconductor device as claimed in claim 8, wherein the insulating material is silicon nitride.

10. A semiconductor device comprising:
    first and second silicon pillars formed substantially perpendicularly to a main surface of a substrate;
    a gate electrode covering side surfaces of the first and second silicon pillars via a gate insulation film;
    first and second diffusion layers provided on a lower part and an upper part of the first silicon pillar, respectively;
    a gate contact connected to the gate electrode;
    a first diffusion layer contact connected to the first diffusion layer; and
    a second diffusion layer contact connected to the second diffusion layer, wherein
    the second diffusion layer contact is formed above the first silicon pillar, and the gate contact is formed above the second silicon pillar.

11. The semiconductor device as claimed in claim 10, wherein a distance between the first silicon pillar and the second silicon pillar is smaller than two times a thickness of the gate electrode.

12. The semiconductor device as claimed in claim 10, further comprising a cap insulation film covering an upper part of the second silicon pillar, wherein
    the gate contact is connected to an upper region of the gate electrode provided on the periphery of the cap insulation film.

13. A semiconductor device comprising:
    first and second silicon pillars formed substantially perpendicularly to a main surface of a substrate;
    a gate electrode covering side surfaces of the first and second silicon pillars via a gate insulation film;
    first and second diffusion layers provided on a lower part and an upper part of the first silicon pillar, respectively;
    a cap insulation film covering an upper part of the second silicon pillar; and
    a gate contact connected to the gate electrode, wherein
    the gate contact is connected to an upper region of the gate electrode provided at the periphery of the cap insulation film, and
    first and second protection insulation films in contact with the upper surfaces of the first and second silicon pillars, respectively,
    wherein the first protection insulation film has an opening to expose a part of upper surface of the first silicon pillar, and the second protection insulation film entirely covers the upper surface of the second silicon pillar.

14. The semiconductor device as claimed in claim 13, wherein the second diffusion layer is in contact with the upper surface of the first silicon pillar via the opening.

15. The semiconductor device as claimed in claim 14, further comprising a cylindrical sidewall insulation film intervening between the second diffusion layer and the gate electrode so as to insulate therebetween.

16. The semiconductor device as claimed in claim 15, wherein a planar position of an external periphery of the cylindrical sidewall insulation film and a planar position of an external periphery of the first silicon pillar substantially coincide with each other.

* * * * *